United States Patent
Hyon et al.

(10) Patent No.: US 10,229,845 B2
(45) Date of Patent: Mar. 12, 2019

(54) SUBSTRATE TREATMENT APPARATUS

(71) Applicant: EUGENE TECHNOLOGY CO., LTD., Yongin-si, Gyeonggi-do (KR)

(72) Inventors: Jun-Jin Hyon, Gunpo-si (KR); Byoung-Gyu Song, Yongin-si (KR); Kyong-Hun Kim, Yongin-si (KR); Yong-Ki Kim, Osan-si (KR); Yang-Sik Shin, Yongin-si (KR); Chang-Dol Kim, Yongin-si (KR)

(73) Assignee: EUGENE TECHNOLOGY CO., LTD., Yongin-si, Gyeonggi-do (KR)

( * ) Notice: Subject to any disclaimer, the term of this patent is extended or adjusted under 35 U.S.C. 154(b) by 302 days.

(21) Appl. No.: 14/915,709

(22) PCT Filed: Oct. 17, 2014

(86) PCT No.: PCT/KR2014/009807
§ 371 (c)(1),
(2) Date: Mar. 1, 2016

(87) PCT Pub. No.: WO2015/057023
PCT Pub. Date: Apr. 23, 2015

(65) Prior Publication Data
US 2016/0195331 A1 Jul. 7, 2016

(30) Foreign Application Priority Data

Oct. 17, 2013 (KR) .................. 10-2013-0123761

(51) Int. Cl.
*H01L 21/67* (2006.01)
*F27B 1/02* (2006.01)
(Continued)

(52) U.S. Cl.
CPC .......... *H01L 21/67109* (2013.01); *F27B 1/02* (2013.01); *F27B 1/10* (2013.01);
(Continued)

(58) Field of Classification Search
CPC ......... H01L 21/67109; H01L 21/67757; H01L 21/67126; H01L 21/67778;
(Continued)

(56) References Cited

U.S. PATENT DOCUMENTS 5,571,330 A * 11/1996 Kyogoku .......... H01L 21/67098
118/715
5,578,132 A * 11/1996 Yamaga .............. C23C 16/4404
118/715
(Continued)

FOREIGN PATENT DOCUMENTS

JP          06-151559 A      5/1994
KR    10-2004-0070960 A    8/2004
(Continued)

*Primary Examiner* — Steven B McAllister
*Assistant Examiner* — Benjamin W Johnson
(74) *Attorney, Agent, or Firm* — Rabin & Berdo, P.C.

(57) ABSTRACT

Provided is a substrate processing apparatus. The substrate processing apparatus includes a chamber body having a passage, through which substrates are transferred, in one side thereof, the chamber body having opened upper and lower portions, an inner reaction tube disposed above the chamber body to provide a process space in which a process with respect to the substrates is performed, the inner reaction tube having an opened lower portion, a substrate holder disposed in the opened lower portion of the chamber to move between a stacking position at which the substrates transferred through the passage are vertically stacked and a process position at which the substrate holder ascends toward the process space to perform the process with respect to the stacked substrates, a blocking plate connected to a lower portion of the substrate holder to ascend or descend together with the substrate holder, the blocking plate closing the opened lower portion of the inner reaction tube at the process position, a connection cylinder vertically disposed on a lower portion of the blocking plate to ascend or descend (Continued)

together with the blocking plate, and a blocking member connected between the opened lower portion of the chamber body and the connection cylinder to isolate the opened lower portion of the chamber body from the outside.

12 Claims, 5 Drawing Sheets

(51) Int. Cl.

| | | |
|---|---|---|
| F27B 1/10 | (2006.01) | |
| F27B 1/20 | (2006.01) | |
| F27B 1/21 | (2006.01) | |
| F27B 3/02 | (2006.01) | |
| F27B 5/04 | (2006.01) | |
| F27B 5/06 | (2006.01) | |
| F27B 5/14 | (2006.01) | |
| F27B 5/16 | (2006.01) | |
| F27B 5/18 | (2006.01) | |
| F27D 3/00 | (2006.01) | |
| H01L 21/677 | (2006.01) | |
| F27B 17/00 | (2006.01) | |

(52) U.S. Cl.
CPC ............... *F27B 1/20* (2013.01); *F27B 1/21* (2013.01); *F27B 3/02* (2013.01); *F27B 5/04* (2013.01); *F27B 5/06* (2013.01); *F27B 5/14* (2013.01); *F27B 5/16* (2013.01); *F27B 5/18* (2013.01); *F27D 3/0084* (2013.01); *H01L 21/67126* (2013.01); *H01L 21/67757* (2013.01); *F27B 17/0033* (2013.01); *H01L 21/67778* (2013.01); *H01L 21/67781* (2013.01)

(58) Field of Classification Search
CPC .... H01L 21/67781; F27D 3/0084; F27B 5/04; F27B 5/18; F27B 5/16; F27B 5/14; F27B 5/06; F27B 1/10; F27B 1/21; F27B 1/20; F27B 1/02; F27B 17/0033
USPC .......................................... 432/125, 128, 121
See application file for complete search history.

(56) References Cited

U.S. PATENT DOCUMENTS

| | | | |
|---|---|---|---|
| 8,043,431 B2 | 10/2011 | Ozaki et al. | |
| 8,057,599 B2 | 11/2011 | Ozaki et al. | |
| 8,282,737 B2 | 10/2012 | Ozaki et al. | |
| 8,293,014 B2 * | 10/2012 | Kurokawa | C23C 16/4404 118/663 |
| 8,460,468 B2 * | 6/2013 | Piechulla | C30B 31/10 118/715 |
| 2004/0154537 A1 | 8/2004 | Chon et al. | |
| 2006/0150904 A1 * | 7/2006 | Ozaki | C23C 16/4401 118/715 |
| 2009/0188431 A1 | 7/2009 | Ozaki et al. | |
| 2012/0006268 A1 | 1/2012 | Ozaki et al. | |

FOREIGN PATENT DOCUMENTS

| | | |
|---|---|---|
| KR | 10-0745932 B1 | 8/2007 |
| KR | 10-1215511 B1 | 12/2012 |
| KR | 10-2013-0054706 A | 5/2013 |

\* cited by examiner

SUBSTRATE TREATMENT APPARATUS

BACKGROUND OF THE INVENTION

The present invention disclosed herein relates to relates to a substrate processing apparatus, and more particularly, to a batch type substrate processing apparatus in which, when a process is performed on a substrate by using an elastic blocking member, a stacking space is controlled in volume to minimize contamination on the substrate, thereby improving quality and productivity.

Substrate processing apparatuses used for manufacturing semiconductors, flat panel displays, photovoltaic cells, and the like may be apparatuses that perform an essential thermal processing process for crystallizing and phase-changing a predetermined thin film that is deposited on a substrate such as a silicon wafer or a glass substrate.

Typically, in case of manufacturing liquid crystal displays or thin-film crystalline silicon photovoltaic cells, there is a silicon crystallization apparatus for crystallizing amorphous silicon deposited on the a glass substrate into polysilicon. To perform the crystallization process, the substrate on which the predetermined thin film has to be heated. For example, it is necessary that a process temperature for crystallizing the amorphous silicon is about 550° C. to about 600° C.

Such a substrate processing apparatus may be classified into a single wafer type substrate processing apparatus in which a substrate processing process is performed on one substrate and a batch type substrate processing apparatus in which a substrate processing process is performed on a plurality of substrates. The single wafer type substrate processing apparatus has an advantage in that its structure is simple. However, the single wafer type substrate process apparatus may be deteriorated in productivity. Thus, the batch type substrate processing apparatus is being in the spotlight as the substrate processing apparatus for mass production.

PRIOR ART DOCUMENT

Patent Document

Korean Patent Publication No. 10-2013-0054706 (May 27, 2013)

SUMMARY OF THE INVENTION

The present invention provides a substrate processing apparatus in which a process with respect to a substrate is performed in a state where a process space is sealed from a stacking space.

The resent invention also provides a substrate processing apparatus in which a stacking space is minimized in volume at a process position of a substrate holder.

Further another object of the present invention will become evident with reference to following detailed descriptions and accompanying drawings.

Embodiments of the present invention provide substrate processing apparatuses including: a chamber body having a passage, through which substrates are transferred, in one side thereof, the chamber body having opened upper and lower portions; an inner reaction tube disposed above the chamber body to provide a process space in which a process with respect to the substrates is performed, the inner reaction tube having an opened lower portion; a substrate holder disposed in the opened lower portion of the chamber to move between a stacking position at which the substrates transferred through the passage are vertically stacked and a process position at which the substrate holder ascends toward the process space to perform the process with respect to the stacked substrates; a blocking plate connected to a lower portion of the substrate holder to ascend or descend together with the substrate holder, the blocking plate closing the opened lower portion of the inner reaction tube at the process position; a connection cylinder vertically disposed on a lower portion of the blocking plate to ascend or descend together with the blocking plate; and a blocking member connected between the opened lower portion of the chamber body and the connection cylinder to isolate the opened lower portion of the chamber body from the outside.

In some embodiments, the blocking member may provide a stacking space communicating with the process space at the stacking position of the substrate holder, and the stacking space may be reduced in volume at the process position of the substrate holder.

In other embodiments, the blocking member may be elastic as the blocking plate is elevated.

In still other embodiments, the connection cylinder may have a protrusion protruding outward from a lower portion thereof, and the blocking member may be connected between the opened lower portion of the chamber body and the protrusion.

In even other embodiments, the connection cylinder may be disposed in a lower portion of the chamber body at the stacking position of the substrate holder and be disposed in the chamber body at the process position of the substrate holder.

In yet other embodiments, the substrate processing apparatuses may further include a manifold disposed on the chamber body, wherein the inner reaction tube may be supported by the manifold.

In further embodiments, the blocking plate may be in contact with the manifold at the process position to define the process space.

In still further embodiments, the manifold may include: a first supply unit for supplying a process gas into the process space; an exhaust unit disposed at a side opposite to that of the first supply unit to exhaust the process gas supplied into the process space; and a second supply unit disposed under the first supply unit to supply a purge gas into the chamber body, wherein the second supply unit may be disposed parallel to the blocking plate at the process position of the substrate holder.

In even further embodiments, the substrate processing apparatuses may further include a sealing member inserted into an installation groove defined along an upper surface of the blocking plate.

In yet further embodiments, the substrate processing apparatuses may further include a cooling passage defined in the blocking plate to allow a refrigerant supplied from the outside to flow therein.

In much further embodiments, the substrate process apparatuses may further include a sealing member inserted into an installation groove defined along an upper surface of the blocking plate, wherein the cooling passage may be disposed adjacent to the sealing member.

In still much further embodiments, the substrate process apparatuses may further include an elevation shaft vertically disposed outside the blocking member; an elevation motor connected to the elevation shaft to rotate the elevation shaft; a support ring connected to a lower portion of the connection cylinder; and a bracket connected to each of the support ring and the elevation shaft, the bracket being elevated together with the support ring by the rotation of the elevation shaft

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Figure 1:
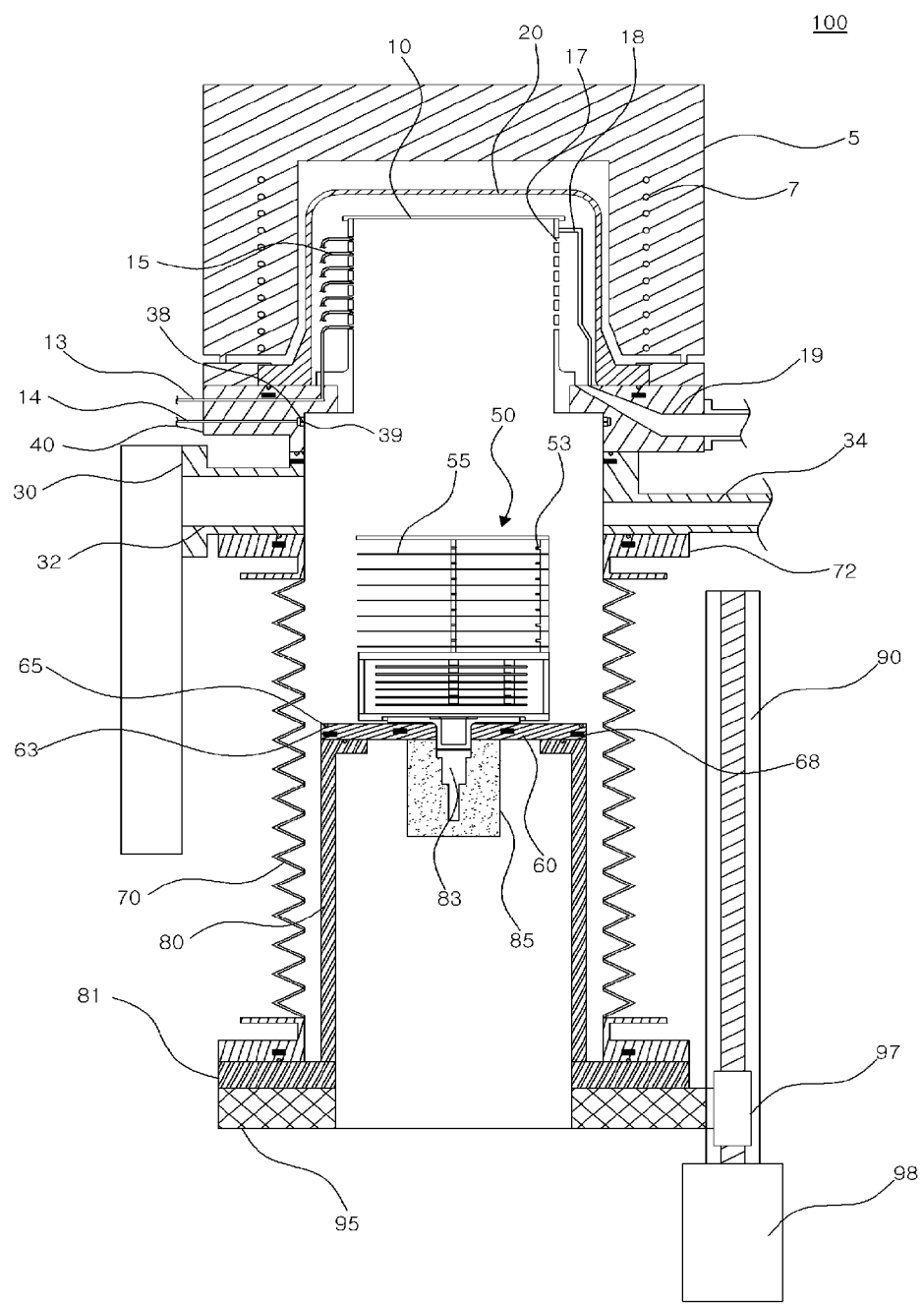
FIG. 1 is a schematic view of a substrate processing apparatus according to an embodiment of the present invention.

Hereinafter, exemplary embodiments of the present invention will be described in detail with reference to FIGS. 1 to 5. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. In the drawings, the shapes of components are exaggerated for clarity of illustration.

Also, it is obvious to a person skilled in the art that the present invention is applicable to various objects to be processed in addition to a substrate W described in the embodiments. For example, the present invention is not limited to a kind of substrate to be processed. Thus, substrates formed of various materials such as glass, plastic, polymer, silicon wafer, stainless steel, sapphire materials and the like, which are generally used in the overall semiconductor manufacturing process. Also, the processing of the substrate may be understood as processing of a predetermined or pattern formed on the substrate as well as processing of the substrate itself.

Also, the substrate processing apparatus of the present invention will not be limited to usage thereof. Thus, the overall semiconductor processes, for example, a deposition process, an etching process, a surface processing process, and the like may be performed by using the substrate processing apparatus according to the present invention. In addition, only main components of the present invention will be described below. Also, it is obvious that various components may be additionally provided to the substrate processing apparatus of the present invention according to purpose of utilization.

FIG. 1 is a schematic view of a substrate processing apparatus according to an embodiment of the present invention. As illustrated in FIG. 1, a substrate processing apparatus 100 includes a chamber body 30 of which an upper portion and a lower portion are opened, a chamber cover 5 covering the upper portion of the chamber body 30, and a blocking member 70 for isolating the opened lower portion of the chamber body 30 from the outside. A substrate W may be transferred into the chamber body 30 through a passage 32 defined in one side of the chamber body 30. A gate valve (not shown) may be disposed on the outside of the passage 32 to open and close the passage 32. Also, an exhaust port 34 may be disposed on a side opposite to the passage. A purge gas that will be described later may be exhausted through the exhaust port 34 to the outside.

Manifolds 40 may be disposed on the upper portion of the chamber body 30, and an inner reaction tube 10 may be supported by the manifolds 40. The inner reaction tube 10 may close the opened upper portion of the chamber body 30 to provide a process space (see reference numeral 2 of FIG. 3) in which a process with respect to the substrate W is performed. The inner reaction tube 10 may have an opened lower portion. First and second supply units 13 and 14 and an exhaust unit 19 may be respectively disposed on inner surfaces of the manifolds 40. Here, the first supply unit 13 may be disposed above the second supply unit 14. An injection nozzle 15 may be connected to the first supply unit 13. A process gas supplied from the outside may be supplied into the injection nozzle 15 through the first supply unit 13 and be supplied onto the substrate through the injection nozzle 15.

The injection nozzles 15 may be inserted along an inner wall of the inner reaction tube 10 and be disposed at heights different from each other along a circumferential direction. The process gas supplied from the injection nozzles 15 may flow toward exhaust nozzles 17 that are disposed at a side opposite to that of the injection nozzles 15 to secure a sufficient time for which the process gas and a surface of the substrate S react with each other. Here, non-reaction gas and reaction by-products generated during the process may be suctioned into an exhaust unit 19 through an exhaust hole 17 and be exhausted to the outside. The purge gas may be supplied into the substrate processing apparatus 100 through the second supply unit 14 and be exhausted through an exhaust port 34. Also, an auxiliary tube 18 may be disposed in the substrate processing apparatus 100 so that the non-reaction gas and the reaction by-products are easily supplied to the exhaust unit 19 through the exhaust hole 17.

Also, in the substrate processing apparatus 100, an outer reaction tube 20 may be disposed outside the inner reaction tube 10 and be disposed outside the injection nozzle 15 and exhaust hole 17. Also, the chamber cover 5 may be disposed outside the outer reaction tube 20. The chamber cover 5 may include a heater 7 for heating the substrate W. The inner reaction tube 10 and the outer reaction tube 20 may be formed of ceramic, quartz, or metal coated with ceramic.

The substrate processing apparatus 100 further includes a substrate holder 50 in which a plurality of substrates are stacked. The substrates W transferred through a passage 32 may be successively loaded on the substrate holder 50 in a vertical direction. A plurality of support tips 53 (or slots) may be vertically disposed in the substrate holder 50 so that the substrates W are easily stacked. Also, a guide plate 55 may be disposed between the support tips 53. The guide plate 55 may have an area greater than that of the substrate W. The gas may be uniformly supplied between the vertically stacked substrates W through the guide plate 55.

The substrate holder 50 may be disposed in a lower portion of the chamber body 30. The substrate holder 50 may ascend by a predetermined distance to allow the substrates W transferred through the passage 32 to be vertically stacked ("stacking position"). The substrate holder 50 on which the substrates W are completely stacked may be transferred to a process position by ascending so that a process with respect to the substrate W is performed. When the substrate holder 50 moves to the process position, a plurality of insulation plates 58 may be disposed below the substrate holder 50 so as to minimize heat loss within a process space (see reference numeral 2 of FIG. 3).

A blocking plate 60 may be disposed under the substrate holder 50. The blocking plate 60 may have an outer diameter greater than that of the substrate 50 with respect to the same center as the substrate holder 50. When the substrate moves to the process position, the blocking plate 60 may contact the manifold 24 to close the opened lower portion of the inner reaction tube 10, thereby providing the process space (see reference numeral 2 of FIG. 3). An installation groove 63 may be defined along a top surface of the blocking plate 60. A sealing member 65 may be inserted into the installation groove 63. The sealing member 65 may minimize a gap between the blocking plate 60 and the manifold 40 to seal a process space (see reference numeral 3 of FIG. 3) from a stacking space (see reference numeral 3 of FIG. 3). The sealing member 65 may be an O-ring formed of silicon.

Also, a cooling passage 68 may be defined in an inner surface of the blocking plate 60. Here, a refrigerant supplied from the outside may flow through the cooling passage 68. The cooling passage 68 may be spaced a predetermined distance from the installation groove 63. The cooling passage 68 may have a shape corresponding to that of the installation groove 63. Thus, when the process with respect to the substrate W is performed at the process position of the substrate holder 50, the process space (see reference numeral 2 of FIG. 3) may prevent the sealing member 65 from being broken due to a high temperature atmosphere of the process space.

A motor housing 85 may be disposed in a lower central portion of the blocking plate 60. A rotation shaft 83 has one side connected to a lower portion of the blocking plate 60. A rotation motor (not shown) rotating the rotation shaft 83 may be fixed to the inside of the motor housing 85. When the substrate holder 50 moves to the process position to perform the process with respect to the substrate W, the rotation motor may drive the rotation shaft 83 to rotate the substrate holder 50.

Also, a connection cylinder 80 may be disposed on a lower side surface of the blocking plate 60. The connection cylinder 80 is vertically disposed toward the lower portion of the blocking plate 60. Also, a protrusion part 81 protruding toward the outside may be disposed on a lower portion of the connection cylinder 80. A blocking member 70 may be connected between the opened lower portion of the chamber body 30 and the protrusion 81 of the connection cylinder 80 to isolate the opened lower portion of the chamber body 30 from the outside, thereby providing the stacking space (see reference numeral 3 of FIG. 3). The stacking space (see reference numeral 3 of FIG. 3) may communicate with the process space (see reference numeral of FIG. 3) at the stacking position of the substrate holder 50. When the substrate holder 50 moves to the process position, the stacking space (see reference numeral 3 of FIG. 3) is sealed from the process space (see reference numeral 2 of FIG. 3).

The blocking member 70 is formed of an elastic material. Since the blocking member 70 ascends together with the connection cylinder 80, the stacking space (see reference numeral 3 of FIG. 3) may be elastically changed in volume. The blocking member 70 may be a bellows. The blocking member 70 may be connected between the chamber body 30 and the connection cylinder 80 through a flange 72. A support ring 95 may be connected to a lower portion of the protrusion part 81 of the connection cylinder 80 to support the connection cylinder 80. A bracket 97 may have one side connected to the support ring 95 and the other side connected to an elevation shaft 90 that is vertically disposed outside the blocking member 70. An elevation motor 98 may be connected to the elevation shaft 90 to drive the elevation shaft 90. Here, the bracket 97 may be elevated together with the support ring 95 by rotation of the elevation shaft 90.

Figure 2:
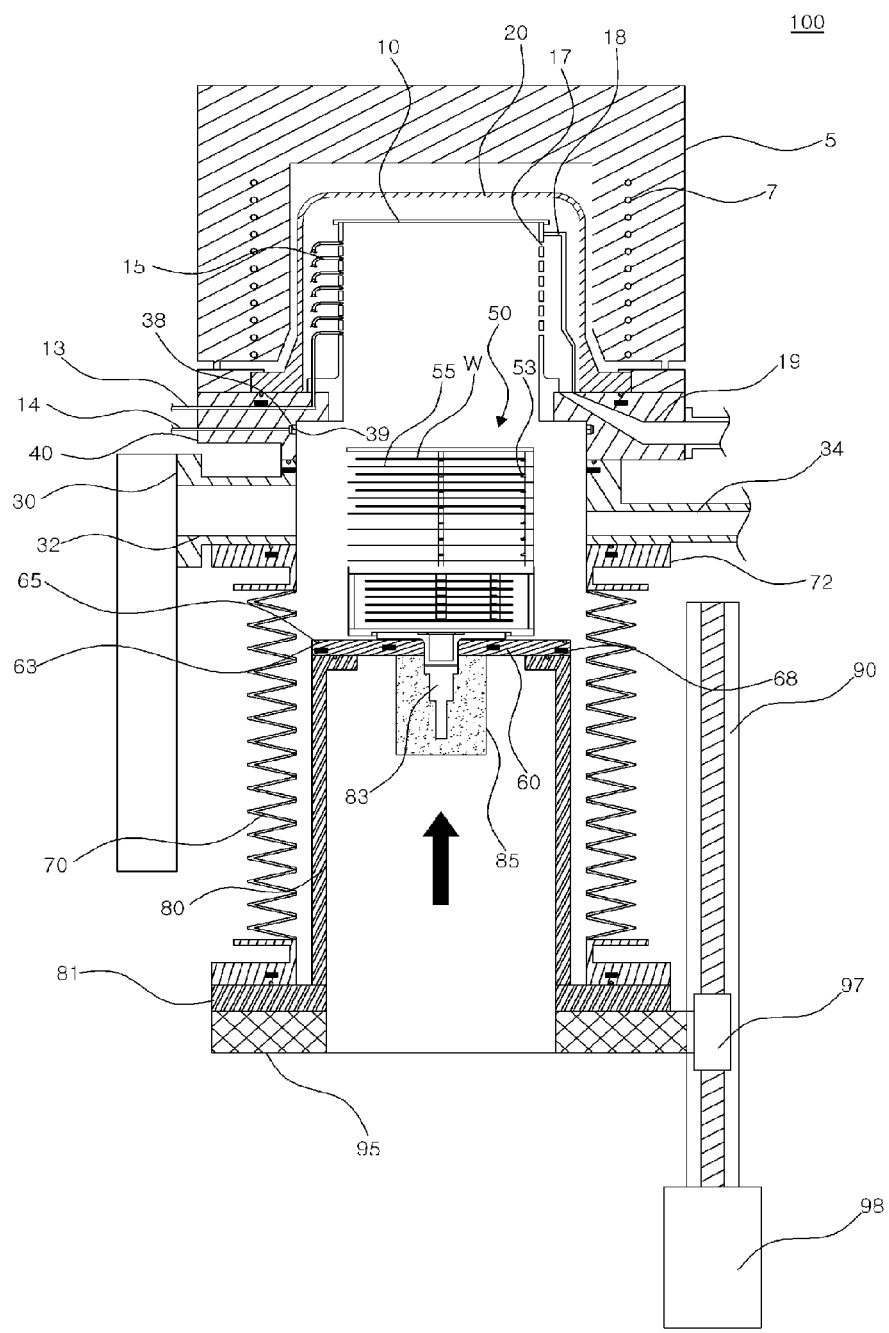
FIGS. 2 and 3 are views illustrating an operation process of the substrate processing apparatus of FIG. 1.
Figure 3:
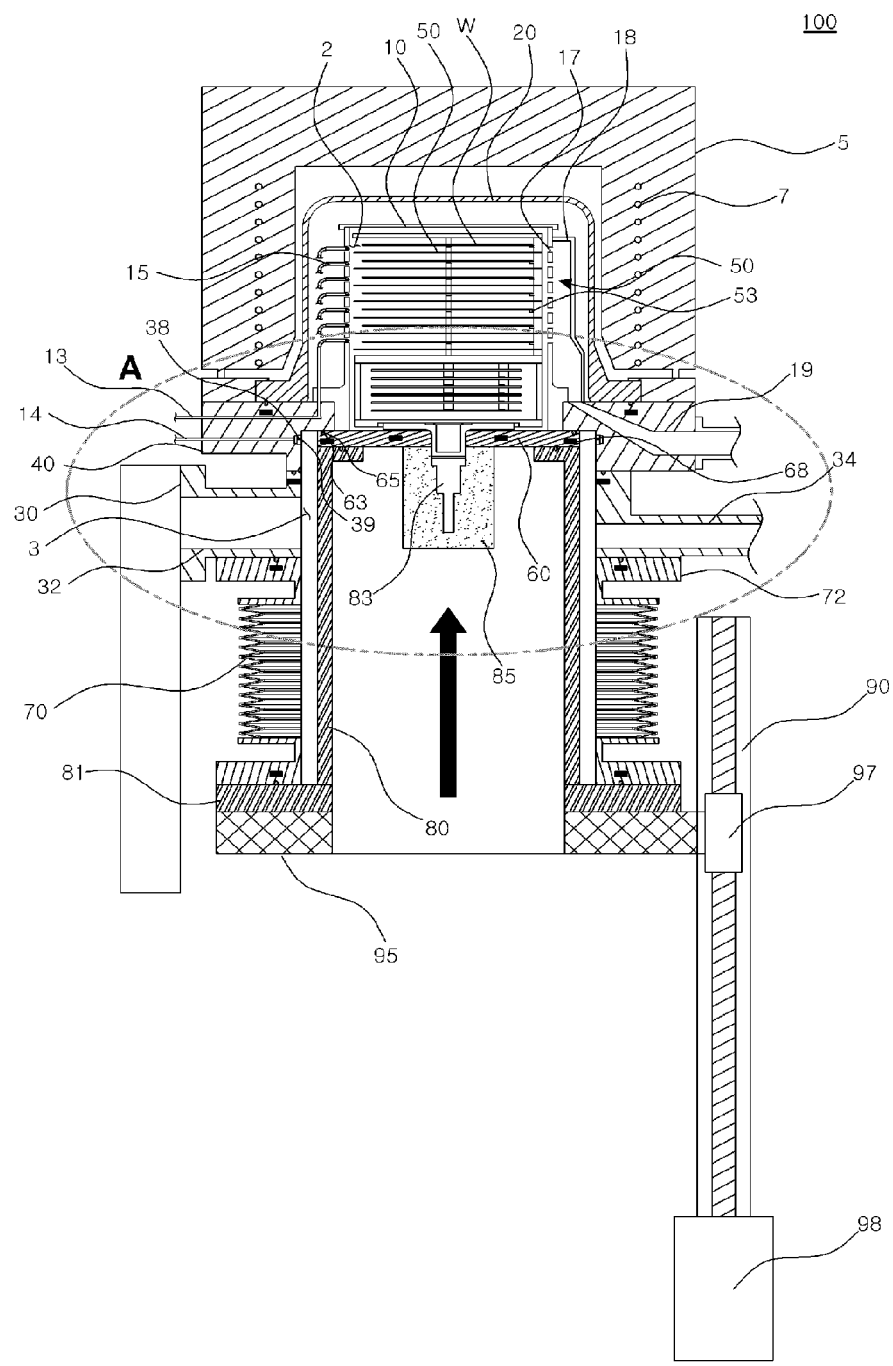
Figure 4:
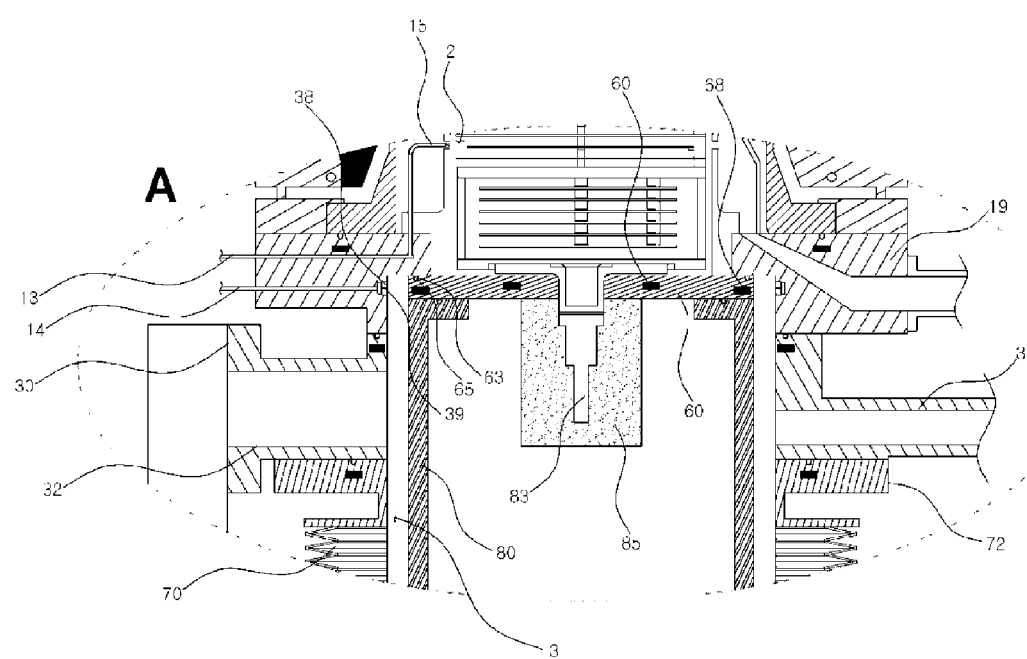
FIG. 4 is an enlarged view of a portion A of FIG. 3.

FIGS. 2 and 3 are views illustrating an operation process of the substrate processing apparatus of FIG. 1, and FIG. 4 is an enlarged view of a portion A of FIG. 3. FIG. 2 is a view illustrating a stacking position of the substrate holder of FIG. 1, and FIG. 3 is a view illustrating a state where the substrate holder of FIG. 1 moves to a process position. Referring to FIG. 2, the substrates W transferred through the passage 32 may be successively loaded on the substrate holder 50. As described above, the substrate holder 50 may be elevated. Here, the substrates W transferred through the passage 32 may be sequentially placed downward on the support tip 53 from an upper side of the substrate holder 50.

When substrates 53 are completely loaded on the substrate holder 50, the substrate holder 50 moves to the process position as illustrated in FIG. 3. When the substrate holder 50 moves to the process position, the blocking plate 60 connected to the lower portion of the substrate holder 50 may be in contact with the manifold 40 and close the opened lower portion of the inner reaction tube 10. Also, the connection cylinder 80 connected to the lower portion of the blocking plate 60 may be elevated together with the substrate holder 50. Also, the blocking member 70 connected between the lower portion of the chamber body 30 and the connection cylinder may have elasticity. Thus, the stacking space 3 may be reduced in volume according to the elevation of the connection cylinder 80.

As illustrated in FIG. 4, the installation groove 63 is defined in the blocking plate 60, and the sealing member 65 is disposed on the installation groove 63 to seal a space between the manifold 40 and the blocking plate 60, thereby tightly sealing the process space 2 from the outside. The cooling passage 68 may be defined to correspond to the installation groove 63 of the blocking plate 60 to prevent the sealing member 65 and the blocking plate 60 from being damaged and thermal-damaged. Also, the sealing members 65 as well as the cooling passage 68 may be respectively disposed between the manifold 40 and the inner reaction tube 10, between the flange 72 and the chamber body 30, and between the chamber body 30 and the manifold 40.

Figure 5:
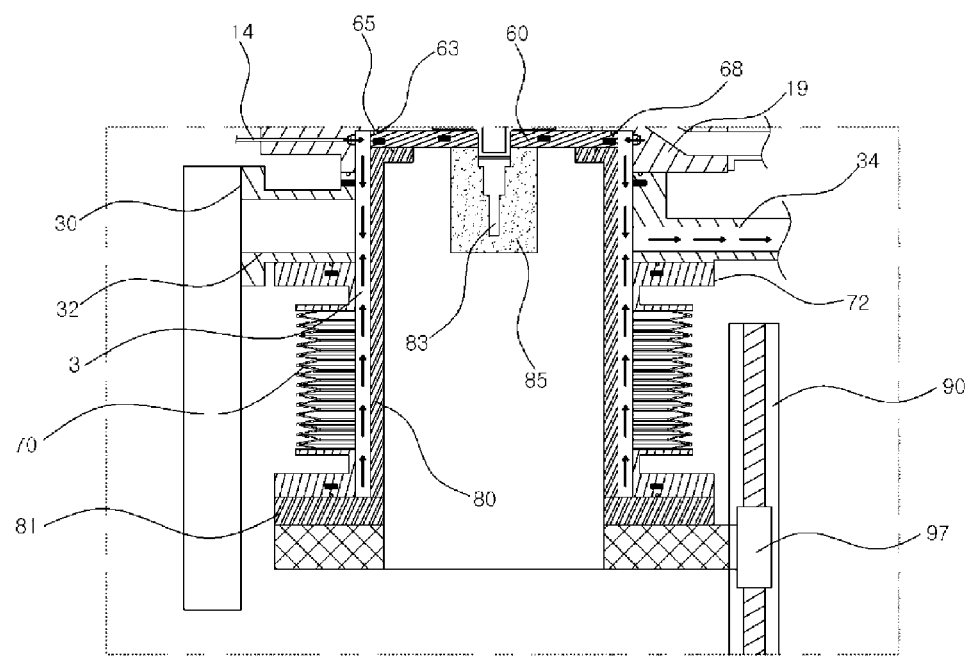
FIG. 5 is a view illustrating a flow state of a purge gas in the substrate processing apparatus of FIG. 3.

FIG. 5 is a view illustrating a flow state of a purge gas in the substrate processing apparatus of FIG. 3. As illustrated in FIG. 5, the second supply unit 14 may be disposed parallel to the blocking plate 60 at the process position of the substrate holder 50. A nozzle ring 38 may be disposed in the chamber body 30 along the second supply unit 14. The purge gas may be supplied into the stacking space 3 through supply holes 39 defined in the nozzle ring 38 along the second supply unit 14. The exhaust port 34 may be defined in a side opposite to a passage of the chamber body 30. Here, the purge gas supplied into the stacking space 3 may be exhausted through the exhaust port 34.

That is, when the substrate holder 50 moves to the process position, the stacking space 3 may be minimized because the blocking member 70 is elastic. The process space 2 and the stacking space 3 may be partitioned by the blocking plate 60 at the process position of the substrate holder 50. A gap between the process space 2 and the stacking space 3 may be minimized by the sealing member 65. Thus, the purge gas in the stacking space 3 may be easily controlled. Also, the stacking space 3 may be minimized. Thus, when the substrate holder 50 descends after the process with respect to the substrate W is completed, damage of the substrate W due to contaminants and particles may be reduced. Thus, the substrate W may be improved in yield and productivity.

According to the embodiment of the present invention, the batch type substrate processing apparatus may perform the process with respect to the substrate in a state where the stacking space is easily sealed from the process space. Also, since the process with respect to the substrate may be performed in a state where the stacking space is minimized in volume, the contaminants occurring on the substrate may be minimized to improve quality and productivity.

Although the present invention is described in detail with reference to the exemplary embodiments, the invention may be embodied in many different forms. Thus, technical idea and scope of claims set forth below are not limited to the preferred embodiments.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A substrate processing apparatus comprising:
    a chamber body having a passage, through which substrates are transferred in one side thereof, the chamber body having opened upper and lower portions;
    a manifold disposed on the chamber body;
    an inner reaction tube disposed on the manifold that provides a process space in which a process with respect to the substrates is performed, the inner reaction tube having an opened lower portion;
    a substrate holder disposed in the opened lower portion of the chamber body that moves between a stacking position at which the substrates transferred through the passage are vertically stacked and a process position at which the substrate holder ascends toward the process space to perform the process with respect to the stacked substrates;
    a blocking plate connected to a lower portion of the substrate holder that ascends or descends together with the substrate holder, the blocking plate being configured to close the opened lower portion of the inner reaction tube at the process position;
    a connection cylinder vertically disposed on a lower portion of the blocking plate that ascends or descends together with the blocking plate;
    a blocking member connected between the opened lower portion of the chamber body and a bottom part of the connection cylinder, thereby providing a stacking space in the opened lower portion of the chamber body, the stacking space communicating with the process space;
    a first supply unit disposed in the manifold for supplying a process gas into the process space;
    an exhaust unit disposed in the manifold, opposite to the first supply unit, for exhausting the process gas supplied into the process space; and
    a second supply unit that supplies a purge gas into the stacking space and is disposed under the first supply unit in the manifold such that when the blocking plate directly contacts the manifold for closing the process space in the process position of the substrate holder, the second supply unit is located at the same level as the blocking plate.

2. The substrate processing apparatus of claim 1, wherein the stacking space is reduced in volume at the process position of the substrate holder.

3. The substrate processing apparatus of claim 1, wherein the blocking member is elastic as the blocking plate is elevated.

4. The substrate processing apparatus of claim 1, wherein the connection cylinder has a protrusion protruding outward from a lower portion thereof, and
    the blocking member is connected between the opened lower portion of the chamber body and the protrusion.

5. The substrate processing apparatus of claim 1, wherein the connection cylinder is disposed beneath a lower portion of the chamber body at the stacking position of the substrate holder and is disposed in the chamber body at the process position of the substrate holder.

6. The substrate processing apparatus of claim 1, wherein the blocking plate contacts the manifold at the process position thereby defining the process space.

7. The substrate processing apparatus of claim 1, further comprising a sealing member inserted into an installation groove defined along an upper surface of the blocking plate.

8. The substrate processing apparatus of claim 1, further comprising a cooling passage defined in the blocking plate to allow a refrigerant supplied from outside of the blocking plate to flow therein.

9. The substrate processing apparatus of claim 8, further comprising a sealing member inserted into an installation groove defined along an upper surface of the blocking plate,
    wherein the cooling passage is disposed adjacent to the sealing member.

10. The substrate processing apparatus of claim 1, further comprising:
    an elevation shaft vertically disposed outside the blocking member;
    an elevation motor connected to the elevation shaft to rotate the elevation shaft;
    a support ring connected to a lower portion of the connection cylinder; and
    a bracket connected to each of the support ring and the elevation shaft, the bracket being elevated together with the support ring by the rotation of the elevation shaft.

11. The substrate processing apparatus of claim 2, wherein the blocking member is elastic as the blocking plate is elevated.

12. The substrate processing apparatus of claim 1, further comprising
    a nozzle ring that connects the second supply unit to the stacking space; and
    supply holes formed in the nozzle ring for supplying purge gas supplied through the second supply unit to the stacking space.

* * * * *